(12) United States Patent
Kumar et al.

(10) Patent No.: US 8,581,769 B2
(45) Date of Patent: Nov. 12, 2013

(54) MULTIPLYING DIGITAL-TO-ANALOG CONVERTER CONFIGURED TO MAINTAIN IMPEDANCE BALANCING

(75) Inventors: Ashish Kumar, Ghaziabad (IN); Chandrajit Debnath, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 43 days.

(21) Appl. No.: 13/302,340

(22) Filed: Nov. 22, 2011

(65) Prior Publication Data

US 2013/0127646 A1    May 23, 2013

(51) Int. Cl.
*H03M 1/14* (2006.01)
(52) U.S. Cl.
USPC ............ 341/161; 341/156; 341/172; 341/150
(58) Field of Classification Search
USPC .................................. 341/156, 161, 162, 172
See application file for complete search history.

(56) References Cited

U.S. PATENT DOCUMENTS

| | | | | |
|---|---|---|---|---|
| 6,249,240 | B1* | 6/2001 | Bellaouar | 341/172 |
| 7,515,086 | B2* | 4/2009 | Ryu | 341/161 |
| 7,812,753 | B1* | 10/2010 | Myles et al. | 341/172 |
| 2002/0039076 | A1* | 4/2002 | Soenen | 341/156 |
| 2005/0116846 | A1* | 6/2005 | Bogner | 341/161 |
| 2009/0128389 | A1* | 5/2009 | Bailey et al. | 341/161 |

* cited by examiner

*Primary Examiner* — Howard Williams
(74) *Attorney, Agent, or Firm* — Graybeal Jackson LLP (57) ABSTRACT

A multiplying digital-to-analog converter suited to maintain impedance balancing during phases. In an embodiment, an input signal may be sampled onto nodes of impedance elements during an initial phase. In a second phase the impedance elements are directly coupled either to a non-inverting reference input or the inverting reference input of an amplifier depending on an output of a related flash ADC output. The determination as to which capacitor is to be coupled to inverting or non-inverting input nodes may be directly programmed into the MDAC using switches, such that a thermometric to binary converter is not required in an example embodiment. Thus, the number of impedance elements coupled to the non-inverting reference input or inverting reference input REFM remains constant in each cycle such that there is no need to settle the non-inverting reference input or inverting reference input to full accuracy.

37 Claims, 5 Drawing Sheets

MULTIPLYING DIGITAL-TO-ANALOG CONVERTER CONFIGURED TO MAINTAIN IMPEDANCE BALANCING

TECHNICAL FIELD

An embodiment broadly relates to a multiplying digital-to-analog converted (MDAC), to a method for converting a digital signal to an analog signal, to a pipelined analog-to-digital converter (ADC), and to a method of converting an analog signal to a digital signal in a plurality of cascading stages.

BACKGROUND

Figure 1:
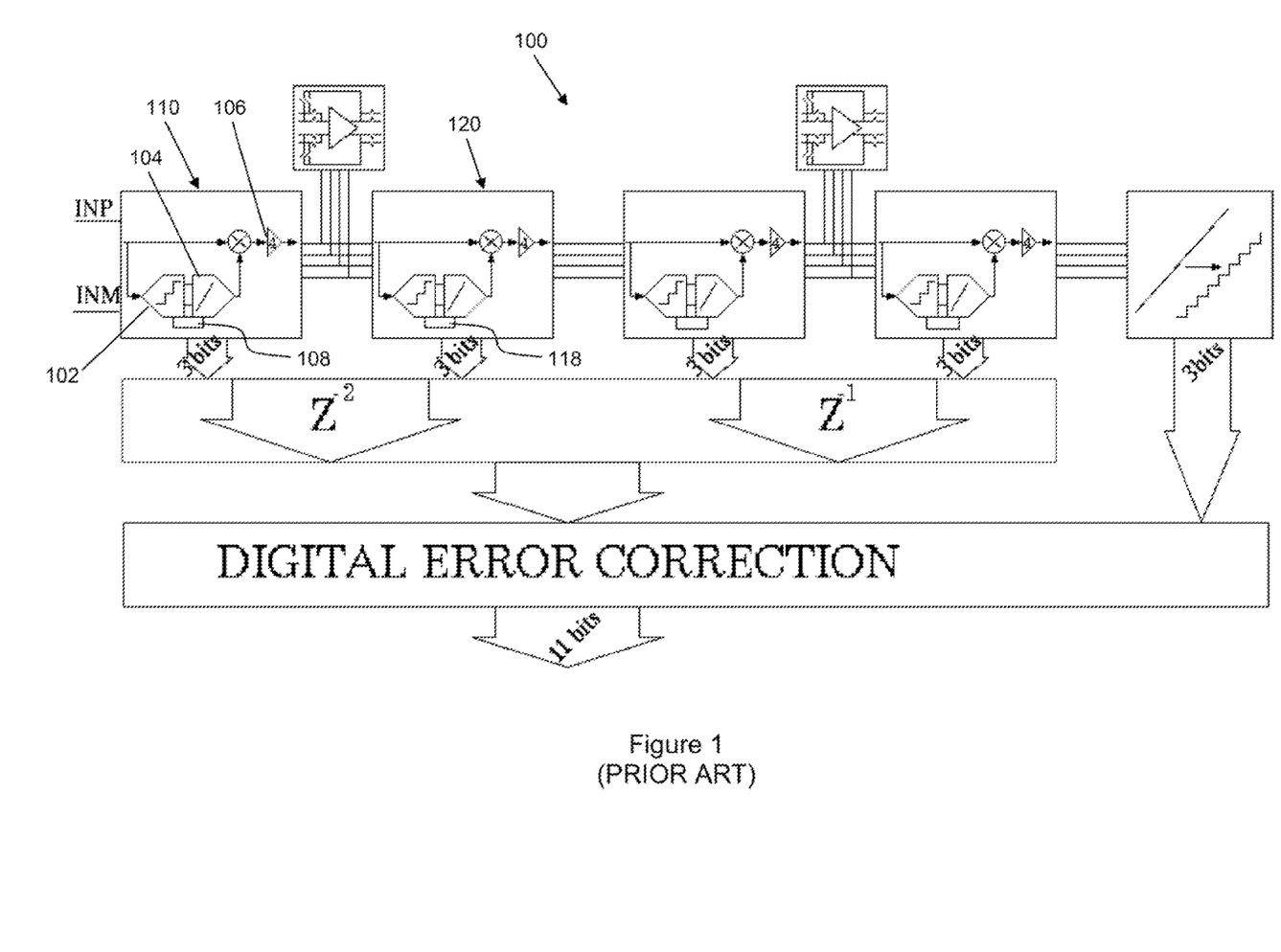
FIG. 1 shows a block diagram illustrating an architecture of a conventional pipelined analog-to-digital converter (ADC).

In a conventional pipelined analog-to-digital converter (ADC), as illustrated in FIG. 1, each stage e.g. 110 typically has one flash ADC e.g. 102 and one MDAC e.g. 104. The output of the flash ADC 102 is a thermometric code, which is converted to a digital code by some digital logic, e.g. circuits 108, 118. The digital code (e.g. a binary code) is then used to select the reference signal for the MDAC 104. The analog output from the MDAC 104 is subtracted from the original input such that the residue portion of the original input is amplified and provided to the next stage e.g. 120, and so on, until all the bits are resolved. However, at high speeds, e.g. about 1 gigahertz (GHz), the delay in the digital logic consumes a major portion of the time in which the output of the MDAC 104 has to settle down. This delay increases the bandwidth requirement of the operational amplifier (op-amp) e.g. 106. It is noted that each pipelined stage typically also has another thermometric to binary code converter (not shown), which outputs the digital bits (e.g. for a 2.5 bit pipelined stage, 3 digital bits) for each stage. The digital bits from each stage then go to the digital error correction logic, and finally the overall digital bits of the ND converter are output.

There have been attempts to implement the pipelined ADC 100, in particular the MDAC 104 (FIG. 1).

Figure 2:
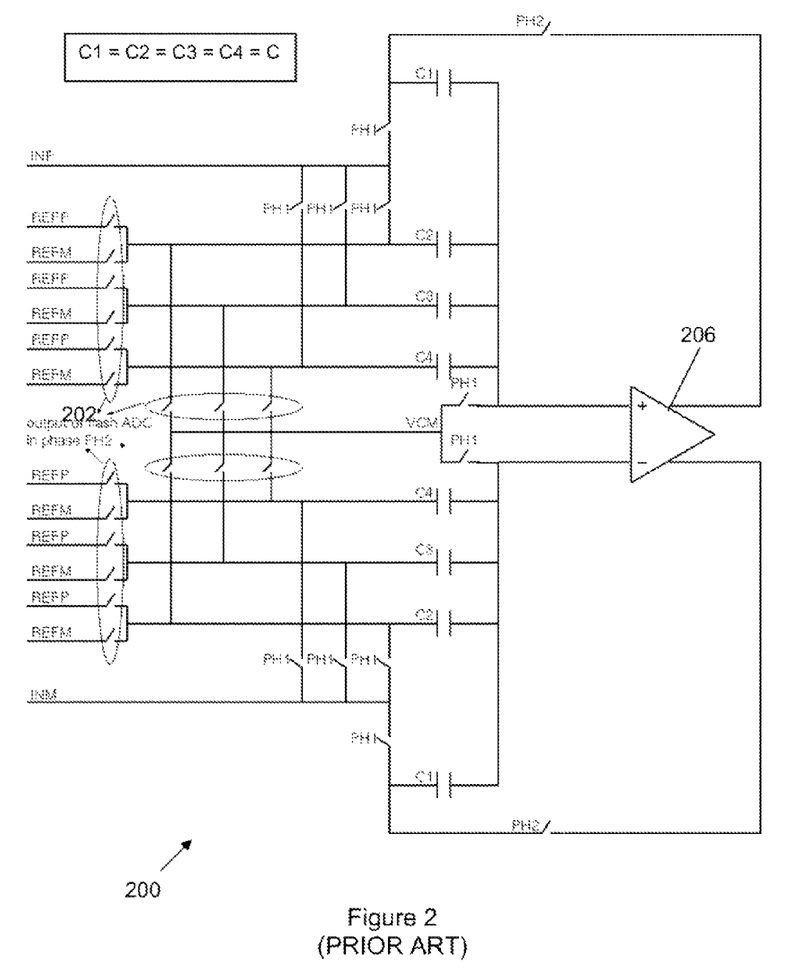
FIG. 2 shows a schematic circuit diagram illustrating a conventional multiplying digital-to-analog converter (MDAC) for a 2.5 bit stage.

FIG. 2 shows a schematic circuit diagram illustrating a conventional MDAC 200 for a 2.5-bit stage. Here, an input signal is sampled onto the bottom plates of four capacitors C1, C2, C3 and C4 of equal capacitance C in a first phase PH1. In a second phase PH2, capacitor C1 is coupled between input and output of the op-amp 206 as a feedback capacitor, and capacitors C2, C3, C4 are either coupled to non-inverting reference input REFP or inverting reference input REFM, or coupled via a low-resistance path to a common mode reference voltage, according to the output of the flash ADC (e.g. 102 in FIG. 1), e.g. using switches e.g. 202.

Output voltage Vres of the MDAC 200 can be given by the following equation:

$$V\text{res}=4*V\text{in}-X*V\text{ref} \quad (1)$$

where X=0, +/−1, +/−2, +/−3 (in binary form) is the input digital value after conversion from the thermometric code; Vin is the voltage level of non-inverting input INP and inverting input INM; Vref is the voltage level of non-inverting reference input REFP and inverting reference input REFM.

When X=0, the bottom plates of capacitors C2, C3, C4 are coupled to the common mode reference voltage, which uses an extra buffer to drive these capacitors. When X={+/−1, +/−2, +/−3}, capacitors C2, C3, C4 are coupled to either the non-inverting reference input REFP or inverting reference input REFM. Therefore, the amount of capacitance changes from cycle to cycle, thus requiring the reference voltage, which is changing, to settle with approximately full accuracy.

SUMMARY

An embodiment of an MDAC addresses at least some of the above problems.

In accordance with a first example embodiment, there is provided a multiplying digital-to-analog converter (MDAC) including:
a plurality of capacitors configured to directly receive an output signal from a flash analog-to-digital converter (ADC) as a reference input signal; and
an operational amplifier configured to receive the reference input signal for generating an analog output signal.

The output signal from the flash ADC may include a non-inverting signal and an inverting signal, and each of the capacitors may be configured to directly receive, in a given clock cycle, either the non-inverting signal or the inverting signal.

The MDAC may further include a plurality of switches configured to apply either the non-inverting signal or the inverting signal to the respective capacitors.

The switches may be configured to apply either the non-inverting signal or the inverting signal to the respective capacitors directly based on a digital value resolved by the flash ADC.

The digital value may include a thermometric code.

The same number of capacitors may be used in each clock cycle for receiving the non-inverting signal and the inverting signal respectively.

Capacitances of the capacitors may be the same.

In accordance with a second example embodiment, there is provided a method for converting a digital signal to an analog signal, the method including:
directly applying, to a plurality of capacitors, an output signal from a flash analog-to-digital converter (ADC) as a reference input signal; and
generating, at an operational amplifier, an analog output signal based on the received reference input signal.

The output signal from the flash ADC may include a non-inverting signal and an inverting signal, and directly applying the output signal from the flash ADC may include applying either the non-inverting signal or the inverting signal to each of the capacitors in a given clock cycle.

An embodiment of a method may further include controlling a plurality of switches for applying either the non-inverting signal or the inverting signal to the respective capacitors.

The switches may be controlled directly based on a digital value resolved by the flash ADC.

The digital value may include a thermometric code.

The method may further include using the same number of capacitors in each clock cycle for receiving the non-inverting signal and the inverting signal respectively.

The capacitances of the capacitors may be the same.

In accordance with a third example embodiment, there is provided a pipelined analog-to-digital converter (ADC) including a plurality of cascading stages, each stage including:
a flash ADC configured to receive an analog input signal;
a multiplying digital-to-analog converter (MDAC) including:
a plurality of capacitors configured to directly receive an output signal from the flash ADC as a reference input signal; and
an operational amplifier configured to receive the reference input signal for generating an analog output signal.

A difference between the analog input signal and the generated analog output signal may be applied as the analog input signal to a next stage.

In accordance with a fourth example embodiment, there is provided a method for converting an analog signal to a digital signal in a plurality of cascading stages, the method including, in each stage:

providing an analog input signal to a flash analog-to-digital converter (ADC);

applying an output signal from the flash ADC to a multiplying digital-to-analog converter (MDAC), the MDAC including:

a plurality of capacitors configured to directly receive the output signal from the flash ADC as a reference input signal; and an operational amplifier configured to receive the reference input signal for generating an analog output signal.

An embodiment of a method may further include applying a difference between the analog input signal and the generated analog output signal as the analog input signal to a next stage.

In accordance with a fifth example embodiment, there is provided a device including the MDAC as defined in the first embodiment.

In accordance with a sixth example embodiment, there is provided a device including a pipelined ADC as defined in the third embodiment.

A device in accordance with the fifth or sixth example embodiments may include a digital oscilloscope, a spectrum analyzer, a medical imaging device, an IF sampling device, a software radio device, a base station, a set-top box, a digital camera, a display device, a DVD device, or a high-definition TV device.

BRIEF DESCRIPTION OF THE DRAWINGS

One or more embodiments will be better understood from the following written description, by way of example only, and in conjunction with the drawings, in which.

DETAILED DESCRIPTION

Figure 3:
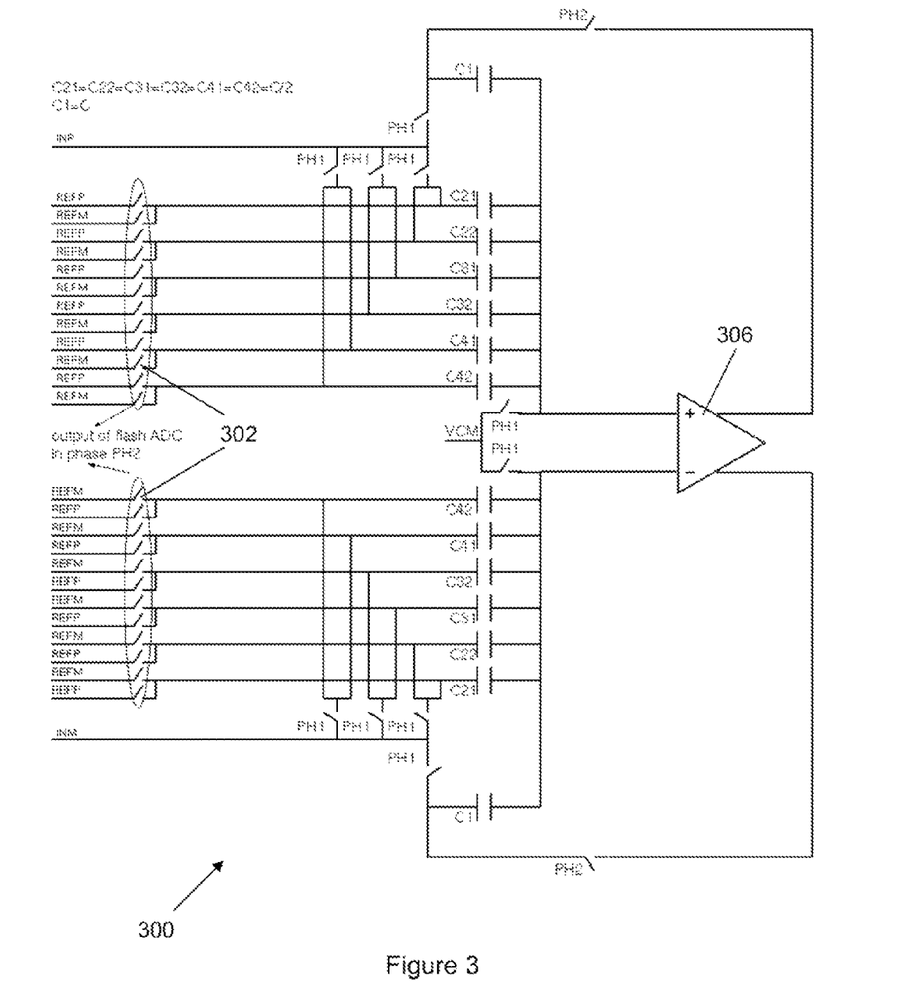
FIG. 3 shows a schematic circuit diagram illustrating a multiplying digital-to-analog converter (MDAC) for a 2.5 bit stage according to an example embodiment.

FIG. 3 shows a schematic circuit diagram illustrating a multiplying digital-to-analog converter (MDAC) 300 for a 2.5 bit stage according to an example embodiment. As shown in FIG. 3, the architecture of the MDAC 300 is configured in an example embodiment in such a way that a thermometric to binary converter is not needed. For example, the output of the flash ADC is directly applied to the MDAC 300.

In an example embodiment, instead of having three capacitors each with a capacitance C, six capacitors C21, C22, C31, C32, C41, C42 each with a capacitance C/2 are used. Capacitor C1 having capacitance value C is not changed with respect to FIG. 2, as shown in FIG. 3. Thus, the amount of capacitance remains the same compared to the design of FIG. 2.

In a first phase PH1, an input signal is sampled onto the bottom plates of all capacitors C1, C21, C22, C31, C32, C41, C42. In a second phase PH2, capacitor C1 is coupled between the input and output of the op-amp 306 as a feedback capacitor, while the bottom plates of capacitors C21, C22, C31, C32, C41, C42 are directly coupled either to the non-inverting reference input REFP or the inverting reference input REFM depending on the flash ADC output. The determination as to which capacitor is to be coupled to input REFP/REFM may be directly programmed into the MDAC 300, e.g. using switches 302, such that a thermometric to binary converter is not required in an example embodiment. In an example implementation, the thermometric code generated from the flash ADC is directly used, and the input REFP/REFM can be coupled to each of the capacitors C21, C22, C31, C32, C41, C42, as shown in FIG. 3.

For example, in a cycle when Vres=4*Vin (i.e. the digital output from the flash ADC is such that the value of X in Equation (1) is 0), at the non-inverting terminal of the op-amp 306, three of the capacitors C21, C22, C31, C32, C41, C42 are coupled to the non-inverting reference input REFP, while the remaining three capacitors are coupled to the inverting reference input REFM. At the same time, at the inverting terminal of the op-amp 306, three of the capacitors C21, C22, C31, C32, C41, C42 are coupled to the inverting reference input REFM, while the remaining three capacitors are coupled to the non-inverting reference input REFP.

When Vres=4*Vin−3*Vref, e.g. in another cycle where the value of X in Equation (1) is 3, at the non-inverting terminal of the op-amp 306, each of the capacitors C21, C22, C31, C32, C41, C42 is coupled to the non-inverting reference input REFP. At the same time, at the inverting terminal of the op-amp 306, each of the capacitors C21, C22, C31, C32, C41, C42 is coupled to the inverting reference input REFM.

When Vres=4*Vin−2Vref, e.g. in yet another cycle where the value of X in Equation (1) is 2, at the non-inverting terminal of the op-amp 306, five of the capacitors C21, C22, C31, C32, C41, C42 are coupled to the non-inverting reference input REFP, while the remaining capacitor is coupled to the inverting reference input REFM. At the same time, at the inverting terminal of the op-amp 306, five of the capacitors C21, C22, C31, C32, C41, C42 are coupled to the inverting reference input REFM, while the remaining capacitor is coupled to the non-inverting reference input REFP.

As described above, the number of capacitors coupled to the non-inverting reference input REFP or inverting reference input REFM remains constant in each cycle such that there is no need to settle the non-inverting reference input REFP or inverting reference input REFM to full accuracy. Therefore, in an example embodiment, the settling time requirement for the reference voltage can be relaxed, which can be an advantage in terms of power.

Moreover, the extra buffer used to couple the bottom plates of the capacitors to the common mode reference voltage in the design of FIG. 2 is advantageously not needed in an example embodiment. Thus, power saving can be achieved as such extra buffer may consume a significant amount of power at e.g. about 1 GHz speed. Also, a thermometric-to-digital-code converter is not required, thus the delay due this digital logic can be advantageously avoided in example embodiments, e.g. for ADC applications at high speeds where the total settling time is of the order of 1 nanoseconds (ns).

Figure 4:
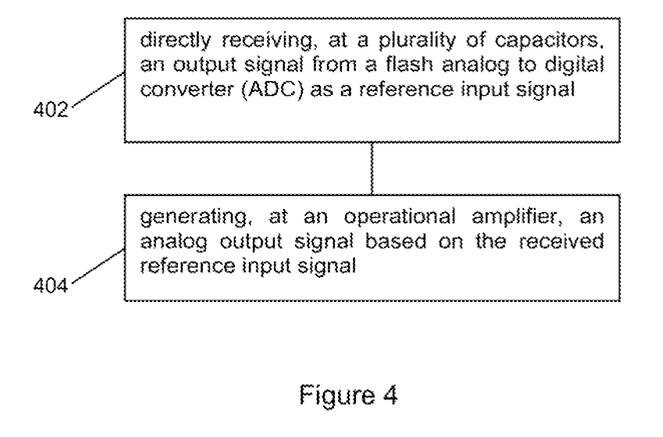
FIG. 4 shows a flow chart illustrating a method for converting a digital signal to an analog signal according to an example embodiment.

FIG. 4 shows a flow chart 400 illustrating a method for converting a digital signal to an analog signal according to an example embodiment. At step 402, at a plurality of capacitors, an output signal from a flash analog-to-digital converter (ADC) is directly received as a reference input signal. At step 404, at an operational amplifier, an analog output signal is generated based on the received reference input signal.

Figure 5:
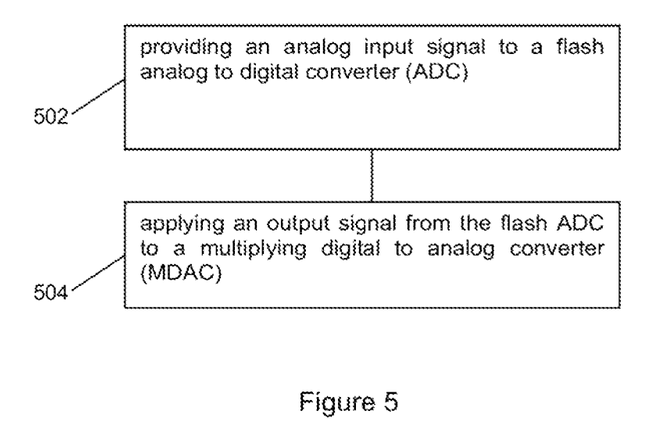
FIG. 5 shows a flow chart illustrating a method for converting an analog signal to a digital in a plurality of cascading stages according to an example embodiment.

FIG. 5 shows a flow chart illustrating a method for converting an analog signal to a digital signal in a plurality of cascading stages according to an example embodiment. In each stage, at step 502, an analog input signal is provided to a flash analog-to-digital converter (ADC). At step 504, an output signal from the flash ADC is applied to a multiplying digital-to-analog converter (MDAC), the MDAC including a plurality of capacitors configured to directly receive the output signal from the flash ADC as a reference input signal; and an operational amplifier configured to receive the reference input signal for generating an analog output signal.

Figure 6:
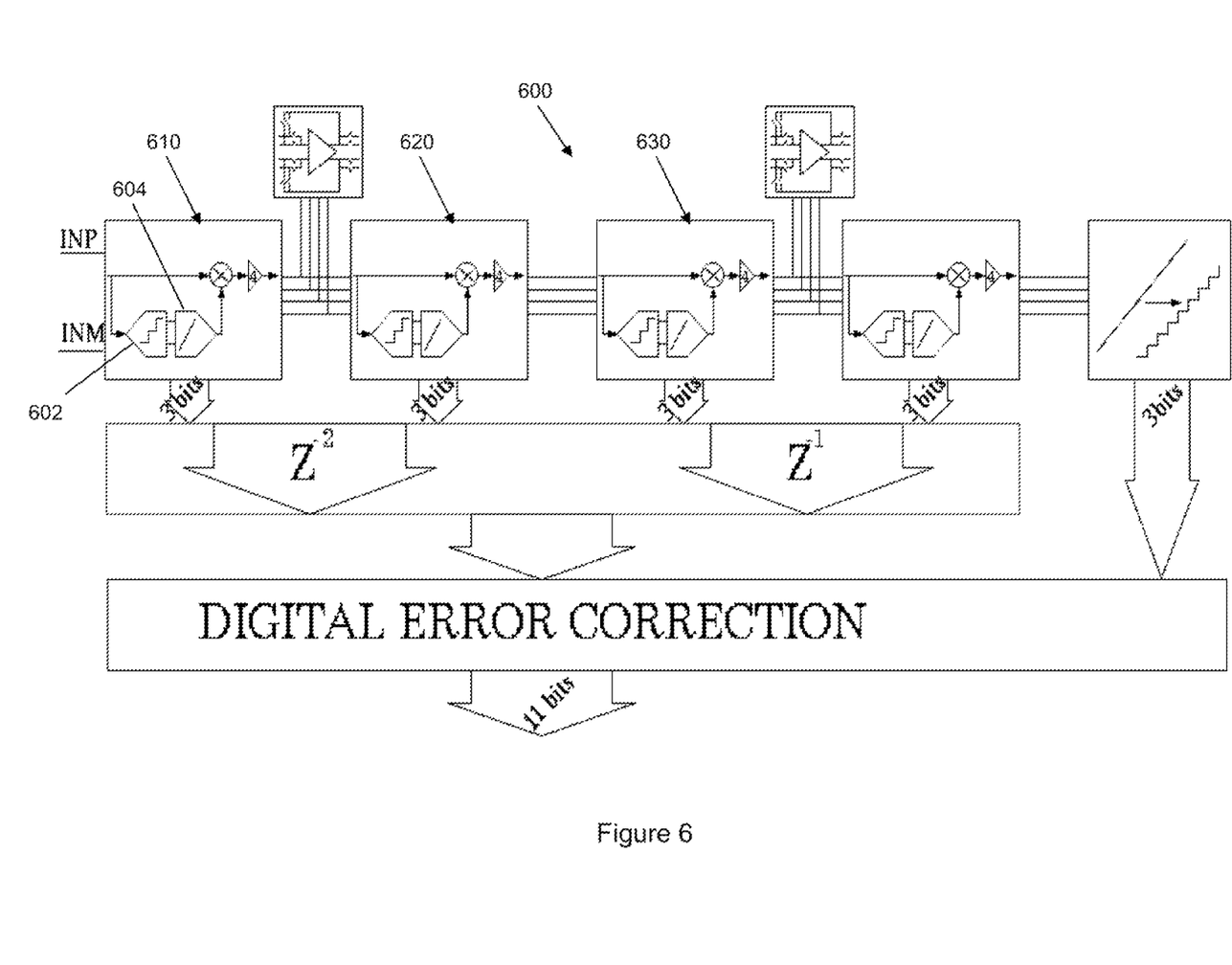
FIG. 6 shows a block diagram illustrating an architecture of a pipelined ADC according to an example embodiment.

FIG. 6 shows a block diagram illustrating a pipelined ADC 600 according to an example embodiment. The pipelined ADC 600 includes a plurality of cascading stages 610, 620, 630, etc. Each stage, e.g. 610, includes a flash ADC, e.g. 602, coupled to an MDAC, e.g. 604. Here, the MDAC 604 may be the same as the MDAC 300 described above with respect to FIG. 3. An output of the flash ADC 602, e.g. in the form of a thermometric code, is directly applied to the MDAC 604 without the need for a thermometric-to-digital-code converter. The analog output from the MDAC 604 is subtracted from the original input such that the residue portion of the original input is amplified and provided to the next stage e.g. 620, and so on, until all the bits are resolved.

Such a high-speed pipelined ADC can, for example, be used in many types of instrumentation applications (such as, but not limited to, a digital oscilloscope, a spectrum analyzer, and a medical imaging device), in video radar communications (such as, but not limited to, an IF sampling device, a software radio device, a base station, a set-top box etc) and in consumer electronics (such as, but not limited to, a digital camera, a display device, a DVD device, and a high-definition TV device).

While this detailed description has set forth some embodiments, other embodiments are contemplated. For example, the number of capacitors and the value of capacitance C may be varied, depending on specific operational requirements such as gain, response time, etc. Within the appended claims, unless the specific term "means for" or "step for" is used within a given claim, it is not intended that the claim be interpreted under 35 U.S.C. 112, paragraph 6.

Moreover, the analog-to-digital converter of FIG. 6 may be coupled to an integrated circuit (e.g., a controller such as a processor) to form a system.

From the foregoing it will be appreciated that, although specific embodiments have been described herein for purposes of illustration, various modifications may be made without deviating from the spirit and scope of the disclosure. For example, although one or more embodiments of a MDAC for a 2.5-bit stage of a pipelined ADC is described, it is understood that above-described techniques may be suitable (or may be modified to be suitable) for other types of DACs, such as MDACs for a 1.5-bit stage of a pipelined ADC, for a 3.5-bit stage of a pipelined ADC, and so on. Moreover, although one or more embodiments of a flash ADC for a 2.5-bit stage of a pipelined ADC is described, it is understood that above-described techniques may be suitable (or may be modified to be suitable) for other types of ADCs, such as flash ADCs for a 1.5-bit stage of a pipelined ADC, for a 3.5-bit stage of a pipelined ADC, and so on. In addition, where an alternative is disclosed for a particular embodiment, this alternative may also apply to other embodiments even if not specifically stated.

The invention claimed is:

1. A multiplying digital-to-analog converter, comprising:
a plurality of capacitors configured to directly receive an output signal from a flash analog-to-digital converter as a reference input signal; and
an operational amplifier configured to receive the reference input signal for generating an analog output signal;
wherein the output signal from the flash analog-to-digital converter includes a non-inverting signal and an inverting signal, and wherein each of the capacitors is configured to directly receive, in each clock cycle, either the non-inverting signal or the inverting signal.

2. The multiplying digital-to-analog converter as claimed in claim 1, further including a plurality of switches configured to apply either the non-inverting signal or the inverting signal to the respective capacitors.

3. The multiplying digital-to-analog converter as claimed in claim 2, wherein the switches are configured to apply either the non-inverting signal or the inverting signal to the respective capacitors directly based on a digital value resolved by the flash analog-to-digital converter.

4. The multiplying digital-to-analog converter as claimed in claim 3, wherein the digital value includes a thermometric code.

5. The multiplying digital-to-analog converter as claimed in claim 1, wherein the same number of capacitors is used in each clock cycle for receiving the non-inverting signal and the inverting signal respectively.

6. The multiplying digital-to-analog converter as claimed in claim 5, wherein capacitances of the capacitors are the same.

7. A method for converting a digital signal to an analog signal, the method comprising:
directly applying, to a plurality of capacitors, an output signal from a flash analog to digital converter as a reference input signal; and
generating, at an operational amplifier, an analog output signal based on the received reference input signal;
wherein the output signal from the flash analog-to-digital converter includes a non-inverting signal and an inverting signal, and wherein directly applying the output signal from the flash analog-to-digital converter includes applying either the non-inverting signal or the inverting signal to each of the capacitors in each clock cycle.

8. The method as claimed in claim 7, further including controlling a plurality of switches for applying either the non-inverting signal or the inverting signal to the respective capacitors.

9. The method as claimed in claim 8, wherein the switches are controlled directly based on a digital value resolved by the flash analog-to-digital converter.

10. The method as claimed in claim 7, further including using the same number of capacitors in each clock cycle for receiving the non-inverting signal and the inverting signal respectively.

11. A pipelined analog-to-digital converter comprising a plurality of cascading stages, each stage but the last including:

a flash analog-to-digital converter configured to receive an analog input signal;
a multiplying digital-to-analog converter including:
a plurality of capacitors configured to directly receive an output signal from the flash analog-to-digital converter as a reference input signal; and
an operational amplifier configured to receive the reference input signal for generating an analog output signal;
wherein the output signal from the flash analog-to-digital converter includes a non-inverting signal and an inverting signal, and wherein each of the capacitors is configured to directly receive, in each clock cycle, either the non-inverting signal or the inverting signal.

12. The pipelined analog-to-digital converter as claimed in claim 11, wherein a difference between the analog input signal and the generated analog output signal is applied as the analog input signal to a next stage.

13. A method for converting an analog signal to a digital signal in a plurality of cascading stages, the method comprising, in each stage but the last:
providing an analog input signal to a flash analog-to-digital converter;
applying an output signal from the flash analog-to-digital converter to a multiplying digital-to-analog converter, the multiplying digital-to-analog converter including:
a plurality of capacitors configured to directly receive the output signal from the as analog-to-digital converter as a reference input signal; and
an operational amplifier configured to receive the reference input signal for generating an analog output signal;
wherein the output signal from the flash analog-to-digital converter includes a non-inverting signal and an inverting signal, and wherein directly applying the output signal from the flash analog-to-digital converter includes applying either the non-inverting signal or the inverting signal to each of the capacitors in each clock cycle.

14. The method as claimed in claim 13, further including applying a difference between the analog input signal and the generated analog output signal as the analog input signal to a next stage.

15. An apparatus, comprising:
a first apparatus input node configurable to receive a first input signal;
first and second reference nodes;
first impedance elements;
an amplifier having a first amplifier input node coupled to the first impedance elements, having a first amplifier output node, and configurable to generate on the first amplifier output node a first output signal that is related to the first input signal; and
a coupler configurable to couple the first impedance elements to the first apparatus input node during a first period, to couple each of the impedance elements to one of the first and second reference nodes during a second period, and to maintain respective impedances on the first and second reference nodes approximately constant from second period to second period.

16. The apparatus of claim 15 wherein the first and second reference nodes are configurable to carry approximately constant first and second reference signals, respectively.

17. The apparatus of claim 15 wherein the impedance elements include capacitors.

18. The apparatus of claim 15 wherein the input and output signals respectively include input and output analog signals.

19. The apparatus of claim 15, further including:
a second impedance element having a first node coupled to the first amplifier input node and having a second node;
wherein each of the first impedance elements includes a respective first node coupled to the first amplifier input node and includes a respective second node;
wherein the coupler is configurable
to couple the second nodes of the first and second impedance elements to the apparatus input node during the first period;
to couple the second node of the second impedance to the first amplifier output node during the second period; and
to couple the second node of each of the first impedance elements to the first reference node or the second reference node during the second period.

20. The apparatus of claim 15, further including:
a second apparatus input node configurable to receive a second input signal;
second impedance elements;
wherein the amplifier includes a second amplifier input node coupled to the second impedance elements, includes a second amplifier output node, and is configurable to generate on the second amplifier output node a second output signal that is related to the second input signal; and
wherein the coupler is configurable to couple the second impedance elements to the second apparatus input node during the first period, and to couple each of the second impedance elements to one of the first and second reference nodes during the second period.

21. The apparatus of claim 20 wherein the first and second apparatus input nodes include differential input nodes.

22. The apparatus of claim 20, further including:
a third impedance element having a first node coupled to the first amplifier input node and having a second node;
a fourth impedance element having a first node coupled to the second amplifier input node and having a second node;
wherein each of the first impedance elements includes a respective first node coupled to the first amplifier input node and includes a respective second node;
wherein each of the second impedance elements includes a respective first node coupled to the second amplifier input node and includes a respective second node; and
wherein the coupler is configurable
to couple the second nodes of the first and third impedance elements to the first apparatus input node during the first period;
to couple the second nodes of the second and fourth impedance elements to the second apparatus input node during the first period;
to couple the second node of the third impedance to the first amplifier output node during the second period;
to couple the second node of the fourth impedance to the second amplifier output node during the second period;
to couple, during the second period, a second node of each of a first number of the first impedance elements to the first reference node, a second node of each of a second number of the first impedance elements to the second reference node, a second node of each of a third number of the second impedance elements to the first reference node, and a second node of each of a fourth number of the second impedance elements to the second reference node such that a first sum of the first and third numbers and a second sum of the second and fourth numbers remains constant from second period to second period.

23. The apparatus of claim 22 wherein the first sum equals the second sum.

24. An apparatus, comprising:

a digital-to-analog converter including:

an apparatus input node configurable to receive an apparatus input signal;

first and second reference nodes;

impedance elements;

an amplifier having an amplifier input node coupled to the impedance elements, having an amplifier output node, and configurable to generate on the amplifier output node an amplifier output signal that is related to the input signal; and a coupler configurable to couple, in response to a digital control signal, the first impedance elements to the first apparatus input node during a first period, to couple each of the impedance elements to one of the first and second reference nodes during a second period, and to maintain respective impedances on the first and second reference nodes approximately constant from second period to second period; and an analog-to-digital converter configurable to generate the digital control signal in response to the first input signal.

25. The apparatus of claim 24 wherein the analog-to-digital converter includes a flash analog-to-digital converter.

26. The apparatus of claim 24 wherein the coupler is directly coupled to the analog-to-digital converter.

27. The apparatus of claim 24, further including combiner configured to generate an apparatus output signal in response to the apparatus input signal and the amplifier output signal.

28. The apparatus of claim 24, further including combiner configured to generate an apparatus output signal approximately equal to a difference between the apparatus input signal and the amplifier output signal.

29. An analog-to-digital converter, comprising:

a digital-to-analog converter including:

an apparatus input node configurable to receive an apparatus input signal;

first and second reference nodes; and at least one stage including:

impedance elements;

an amplifier having an amplifier input node coupled to the impedance elements, having an amplifier output node, and configurable to generate on the amplifier output node an amplifier output signal that is related to the input signal; and a coupler configurable to couple, in response to a digital control signal, the first impedance elements to the first apparatus input node during a first period, to couple each of the impedance elements to one of the first and second reference nodes during a second period, and to maintain respective impedances on the first and second reference nodes from the at least one stage approximately constant from second period to second period; and an analog-to-digital converter configurable to generate the digital control signal in response to the apparatus input signal.

30. A system, comprising:

an analog-to-digital converter, comprising:

a digital-to-analog converter including:

an apparatus input node configurable to receive an apparatus input signal;

first and second reference nodes; and at least one stage including:

impedance elements;

an amplifier having an amplifier input node coupled to the impedance elements, having an amplifier output node, and configurable to generate on the amplifier output node an amplifier output signal that is related to the input signal; and a coupler configurable to couple, in response to a digital control signal, the first impedance elements to the first apparatus input node during a first period, to couple each of the impedance elements to one of the first and second reference nodes during a second period, and to maintain respective impedances on the first and second reference nodes from the at least one stage approximately constant from second period to second period; and an analog-to-digital converter configurable to generate the digital control signal in response to the apparatus input signal; and an integrated circuit coupled to the analog-to-digital converter.

31. The system of claim 30 wherein the analog-to-digital converter and the integrated circuit are disposed on a same die.

32. The system of claim 30 wherein the analog-to-digital converter and the integrated circuit are disposed on respective dies.

33. The system of claim 30 wherein the integrated circuit includes a controller.

34. A method, comprising:

generating an output signal in response to an input signal and a modify signal during signal-generating periods; and maintaining a settling time of the modify signal approximately constant from period to period.

35. The method of claim 34, further including:

generating the modify signal in response to reference signals; and maintaining the settling time approximately constant includes maintaining respective impedances coupled to the reference signals approximately constant from period to period.

36. The method of claim 34, further including:

generating the modify signal in response to reference signals; and maintaining the settling time approximately constant includes maintaining respective numbers of approximately equal impedances coupled to the reference signals constant from period to period.

37. The method of claim 34, further including:

generating the modify signal in response to reference signals; and maintaining the settling time approximately constant includes maintaining respective numbers of approximately equal impedances coupled to the reference signals equal and constant from period to period.

* * * * *

UNITED STATES PATENT AND TRADEMARK OFFICE
CERTIFICATE OF CORRECTION

| | |
|---|---|
| PATENT NO. | : 8,581,769 B2 |
| APPLICATION NO. | : 13/302340 |
| DATED | : November 12, 2013 |
| INVENTOR(S) | : Ashish Kumar and Chandrajit Debnath |

It is certified that error appears in the above-identified patent and that said Letters Patent is hereby corrected as shown below:

In the Claims:

Column 7, line 28, the phrase "output signal from the as analog-to-digital converter" should read -output signal from the flash analog-to-digital converter- Signed and Sealed this
Fourth Day of March, 2014

Michelle K. Lee
*Deputy Director of the United States Patent and Trademark Office*